(12) United States Patent
Wu et al.

(10) Patent No.: US 9,929,168 B2
(45) Date of Patent: Mar. 27, 2018

(54) EMBEDDED MEMORY AND METHODS OF FORMING THE SAME

(71) Applicant: Taiwan Semiconductor Manufacturing Company, Ltd., Hsin-Chu (TW)

(72) Inventors: Wei Cheng Wu, Hsinchu County (TW); Harry-Hak-Lay Chuang, Singapore (SG)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/161,766

(22) Filed: May 23, 2016

(65) Prior Publication Data

US 2016/0268284 A1   Sep. 15, 2016

Related U.S. Application Data

(62) Division of application No. 13/924,297, filed on Jun. 21, 2013, now Pat. No. 9,349,742.

(51) Int. Cl.

| | |
|---|---|
| H01L 27/11568 | (2017.01) |
| H01L 21/28 | (2006.01) |
| H01L 27/105 | (2006.01) |
| H01L 27/11573 | (2017.01) |
| H01L 27/11 | (2006.01) |
| H01L 21/8234 | (2006.01) |
| H01L 29/66 | (2006.01) |
| H01L 21/02 | (2006.01) |
| H01L 29/51 | (2006.01) |

(52) U.S. Cl.
CPC .... H01L 27/11568 (2013.01); H01L 21/0214 (2013.01); H01L 21/02164 (2013.01); H01L 21/02236 (2013.01); H01L 21/28282 (2013.01); H01L 21/823462 (2013.01); H01L 27/105 (2013.01); H01L 27/1116 (2013.01); H01L 27/11573 (2013.01); H01L 29/513 (2013.01); H01L 29/66545 (2013.01); H01L 29/66833 (2013.01); H01L 21/02255 (2013.01)

(58) Field of Classification Search
CPC ............. H01L 27/11568; H01L 29/513; H01L 21/28282; H01L 21/0214; H01L 29/66833; H01L 21/02236; H01L 21/02164; H01L 27/11573; H01L 29/66545
See application file for complete search history.

(56) References Cited

U.S. PATENT DOCUMENTS

| | | |
|---|---|---|
| 6,596,605 B2 | 7/2003 | Ha et al. |
| 7,091,118 B1 | 8/2006 | Pan et al. |

(Continued)

*Primary Examiner* — Tom Thomas
*Assistant Examiner* — Vincent Wall
(74) *Attorney, Agent, or Firm* — Haynes and Boone, LLP

(57) ABSTRACT

A method for forming an embedded flash memory device includes a gate stack, and source and drain regions in the semiconductor substrate is disclosed. The first source and drain regions are on opposite sides of the gate stack. The gate stack includes a bottom dielectric layer over the semiconductor substrate, a charge trapping layer over the bottom dielectric layer, a top dielectric layer over the charge trapping layer, a high-k dielectric layer over the top dielectric layer, and a metal gate over the high-k dielectric layer.

20 Claims, 16 Drawing Sheets

(56) References Cited

U.S. PATENT DOCUMENTS

| | | | |
|---|---|---|---|
| 7,126,199 B2 * | 10/2006 | Doczy | H01L 21/823828 |
| | | | 257/213 |
| 7,348,636 B2 * | 3/2008 | Ryu | H01L 27/092 |
| | | | 257/369 |
| 8,409,950 B1 * | 4/2013 | Shea | H01L 21/823456 |
| | | | 257/E21.679 |
| 2005/0088889 A1 | 4/2005 | Lee et al. | |
| 2006/0261401 A1 | 11/2006 | Bhattacharyya | |
| 2008/0090350 A1 * | 4/2008 | Yan | H01L 27/105 |
| | | | 438/257 |
| 2009/0181530 A1 * | 7/2009 | Lisiansky | H01L 21/02178 |
| | | | 438/591 |
| 2010/0072535 A1 | 3/2010 | Takashima et al. | |
| 2010/0244207 A1 | 9/2010 | Takayanagi | |
| 2011/0073964 A1 * | 3/2011 | Chowdhury | H01L 21/823462 |
| | | | 257/411 |
| 2011/0193154 A1 | 8/2011 | Joo et al. | |
| 2011/0195549 A1 * | 8/2011 | Chuang | H01L 21/28088 |
| | | | 438/216 |
| 2013/0270647 A1 * | 10/2013 | Zhu | H01L 21/022 |
| | | | 257/369 |
| 2013/0285151 A1 | 10/2013 | Wu et al. | |

* cited by examiner

US 9,929,168 B2

EMBEDDED MEMORY AND METHODS OF FORMING THE SAME

This is a divisional of U.S. Ser. No. 13/924,297 filed Jun. 21, 2013, which is hereby incorporated by reference.

BACKGROUND

Flash memories, which use dielectric trapping layers or floating layers to store charges, are often used in System-On-Chip (SOC) technology, and are formed on the same chip along with other integrated circuits. For example, High-Voltage (HV) circuits, Input/output (IO) circuits, core circuits, and Static Random Access Memory (SRAM) circuits are often integrated on the same chip as the flash memories. The respective flash memories are often referred to as embedded memories since they are embedded in the chip on which other circuits are formed, as compared to the flash memories formed on chips that do not have other circuits. Flash memories have structures different from HV circuit devices, IO circuit devices, core circuit devices, and SRAM circuit devices. Therefore, embedding memory devices with other types of devices faces challenges when the technology evolves.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An embedded memory device and the methods of forming the same are provided in accordance with various exemplary embodiments. The intermediate stages of forming the embedded memory device are illustrated. The variations of the embodiments are discussed. Throughout the various views and illustrative embodiments, like reference numbers are used to designate like elements.

Figure 1:
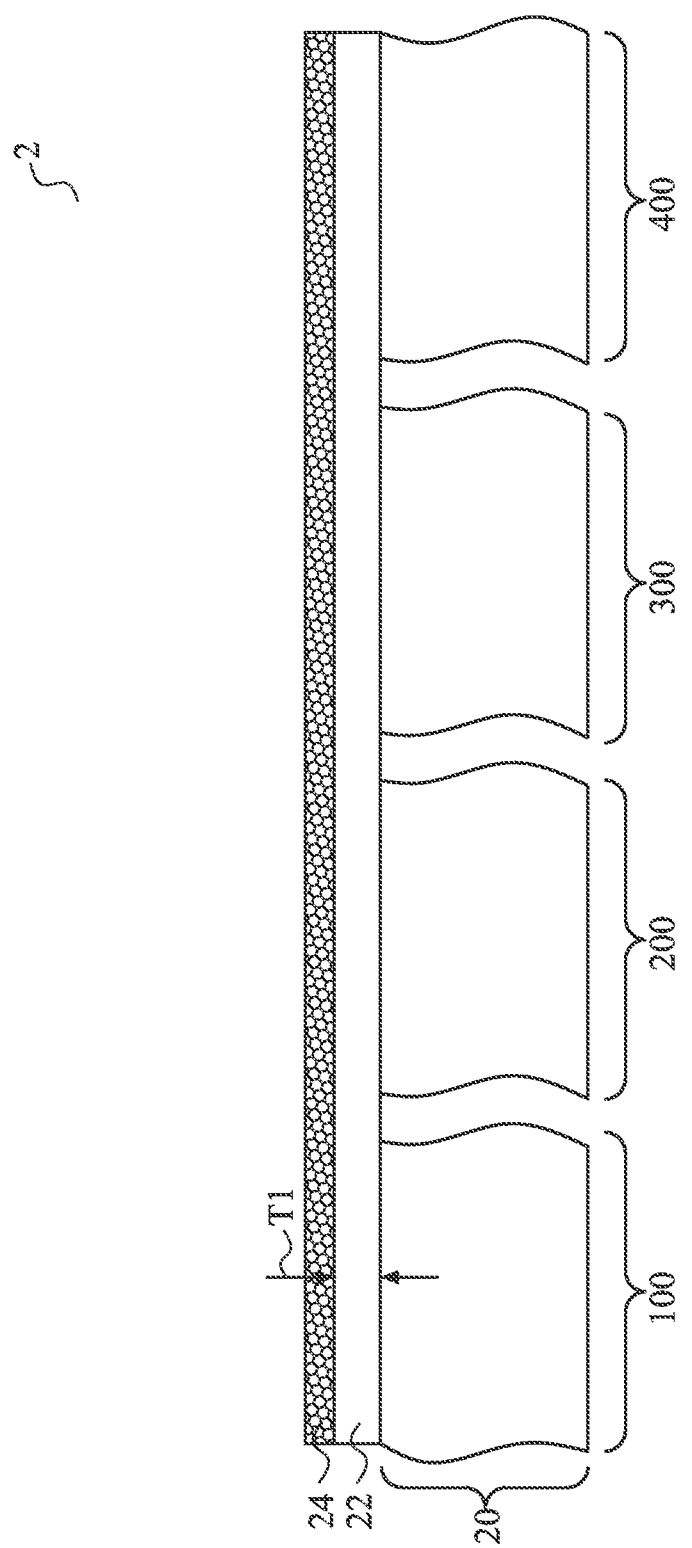
FIGS. 1, 2, 3, 4, 5, 6, 7, 8, 9, 10, 11, 12, and 13 are cross-sectional views of intermediate stages in the manufacturing of embedded memory devices and other types of devices in accordance with some exemplary embodiments, wherein a gate-last approach is used.

Referring to FIG. 1, semiconductor substrate 20, which is a part of semiconductor wafer 2, is provided. In some embodiments, semiconductor substrate 20 includes crystalline silicon. Other commonly used materials such as carbon, germanium, gallium, boron, arsenic, nitrogen, indium, phosphorus, and/or the like, may also be included in semiconductor substrate 20. Semiconductor substrate 20 may be a bulk substrate or a Semiconductor-On-Insulator (SOI) substrate. In some exemplary embodiments, semiconductor substrate 20 comprises $Si_{1-z}Ge_z$, wherein value z is the atomic percentage of germanium in SiGe, and may be any value ranging from, and including, 0 and 1. For example, when value z is 0, semiconductor substrate 20 comprises a crystalline silicon substrate. When value z is 1, semiconductor substrate 20 comprises a crystalline germanium substrate. Substrate 20 may also have a compound structure including a III-V compound semiconductor on a silicon substrate, or a silicon germanium (or germanium) layer on a silicon substrate.

Semiconductor substrate 20 includes portions in regions 100, 200, 300, and 400. In accordance with some embodiments, regions 100, 200, 300, and 400 include an embedded flash memory region, a High-Voltage (HV) region, an Input/output (IO) region, and a Static Random Access Memory (SRAM)/general logic (core) device region, respectively. Embedded flash memory region 100 is used for forming embedded flash memory cells (such as 156 in FIGS. 13 and 16) therein. HV region 200 is used for forming HV devices (such as 256 in FIGS. 13 and 16) therein. IO Region 300 is used for forming IO devices (such as 356 in FIGS. 13 and 16) therein. Core/SRAM Region 400 is used for forming core devices and/or SRAM cells (such as 456 in FIGS. 13 and 16) therein. The core devices, sometimes referred to as logic devices, do not include any memory array therein, and may be, or may not be, in the peripheral region of SRAM arrays. For example, the core devices may be in the driver circuit or the decoder circuit of the SRAM arrays (in region 400) or the memories in region 100. The HV devices are supplied with, and are configured to endure, a positive power supply voltage Vdd1 higher than the positive power supply voltage Vdd2 of the devices in region SRAM/core region 400. For example, power supply voltage Vdd2 may be lower than about 1V, and power supply voltage Vdd1 may be between about 1.5V and about 3.3V. Although portions of substrate 20 in regions 100, 200, 300, and 400 are shown as disconnected, they are portions of the same continuous substrate 20.

As also shown in FIG. 1, bottom dielectric layer 22 is formed on substrate 20. In some embodiments, bottom dielectric layer 22 is formed of silicon oxide, which may be formed by performing a thermal oxidation on substrate 20. In alternative embodiments, bottom dielectric layer 22 comprises silicon oxynitride or other dielectric materials that have low leakage of charges, which may be deposited. In some embodiments, thickness T1 of bottom dielectric layer 22 is between about 20 Å and about 60 Å. It is appreciated, however, that the values recited throughout the description are merely examples, and may be changed to different values.

Charge trapping layer 24 is formed over bottom dielectric layer 22. Charge trapping layer 24 may be a dielectric layer with a high trap density. In some embodiment, charge trapping layer 24 comprises silicon nitride (SiN), which may be deposited using Physical Vapor Deposition (PVD). In other embodiments, charge trapping layer 24 include other materials including, and not limited to, oxides, nitrides, and oxynitrides. For example, charge trapping layer 24 may include AlN, $Al_2O_3$, $HfO_2$, HfON, ZrON, or combinations thereof.

Figure 2:
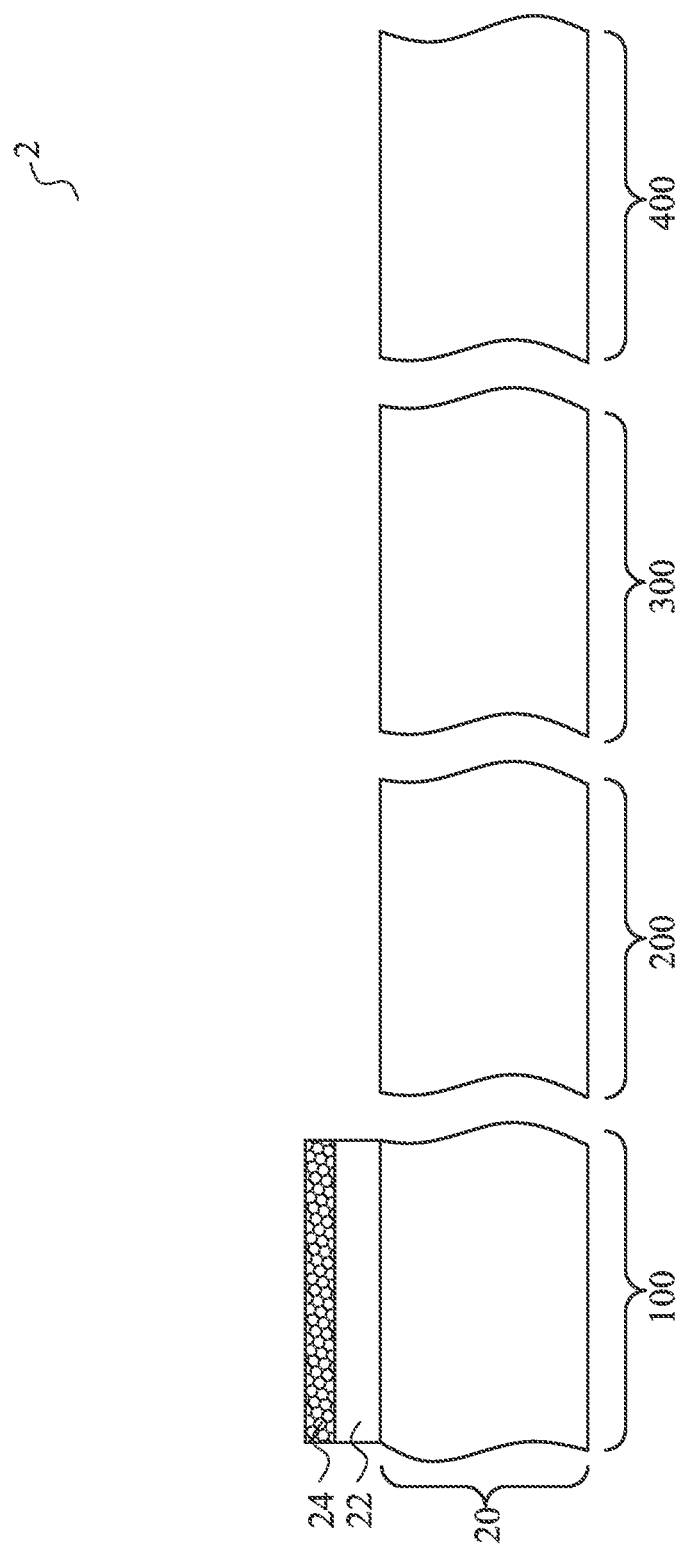
Figure 3:
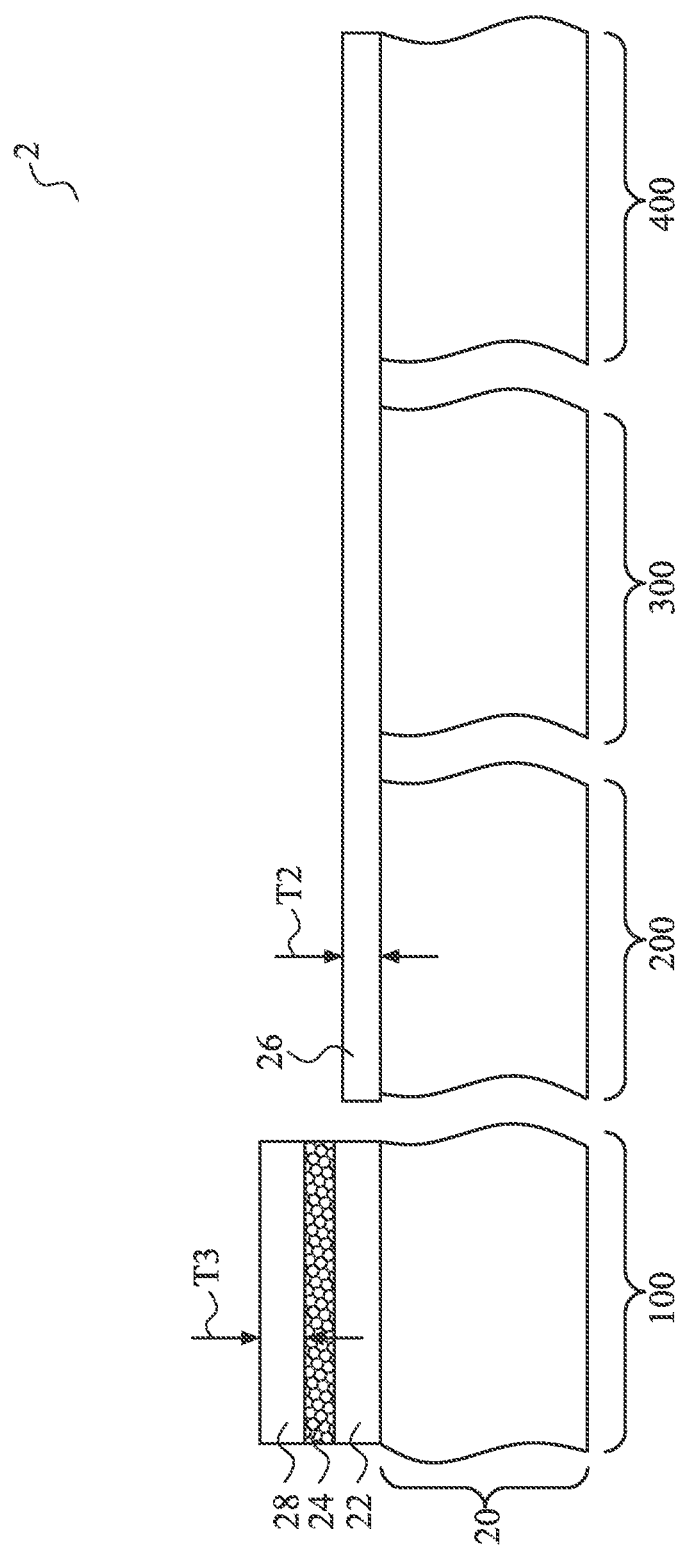

Referring to FIG. 2, bottom dielectric layer 22 and charge trapping layer 24 are patterned in an etching step. The portions of bottom dielectric layer 22 and charge trapping layer 24 are removed from regions 200, 300, and 400. The portion of bottom dielectric layer 22 and charge trapping layer 24 in region 100 are left un-removed. After the patterning, as shown in FIG. 3, HV dielectric layer 26 is formed in regions 200, 300, and 400. Thickness T2 of HV dielectric layer 26 may be between about 50 Å and about 300 Å. Top dielectric layer 28 is also formed in region 100 and over charge trapping layer 24. Thickness T3 of top dielectric layer 28 may be between about 60 Å and about 200 Å.

In accordance with some embodiments, HV dielectric layer 26 and top dielectric layer 28 are formed in separate processes. For example, HV dielectric layer 26 is formed using thermal oxidation by oxidizing substrate 20. Accordingly, HV dielectric layer 26 is formed in regions 200, 300, and 400, and not in region 100. Top dielectric layer 28, on the other hand, may be formed using deposition, which may be performed using a Chemical Vapor Deposition (CVD) method such as Plasma Enhance CVD (PECVD), Low Pressure CVD (LPCVD), Atomic Layer Deposition (ALD), or the like. In these embodiments, thickness T2 of HV dielectric layer 26 and thickness T3 of top dielectric layer 28 may be different from each other. The materials of HV dielectric layer 26 and top dielectric layer 28 may also be different from each other or same as each other. With HV dielectric layer 26 and top dielectric layer 28 formed separately, thicknesses T2 and T3 may be adjusted to optimize the performance of the memory device and the HV device formed in regions 100 and 200, respectively. In other embodiments, HV dielectric layer 26 and top dielectric layer 28 are formed simultaneously in a same deposition process. In these embodiments, thickness T2 is equal to thickness T3. By forming HV dielectric layer 26 and top dielectric layer 28 simultaneously, the manufacturing cost may be reduced. HV dielectric layer 26 and top dielectric layer 28 may comprise silicon oxide, silicon oxynitride, or the like. The dielectric constant of the HV dielectric layer 26 and top dielectric layer 28 may be about 3.8 in some embodiments.

Figure 4:
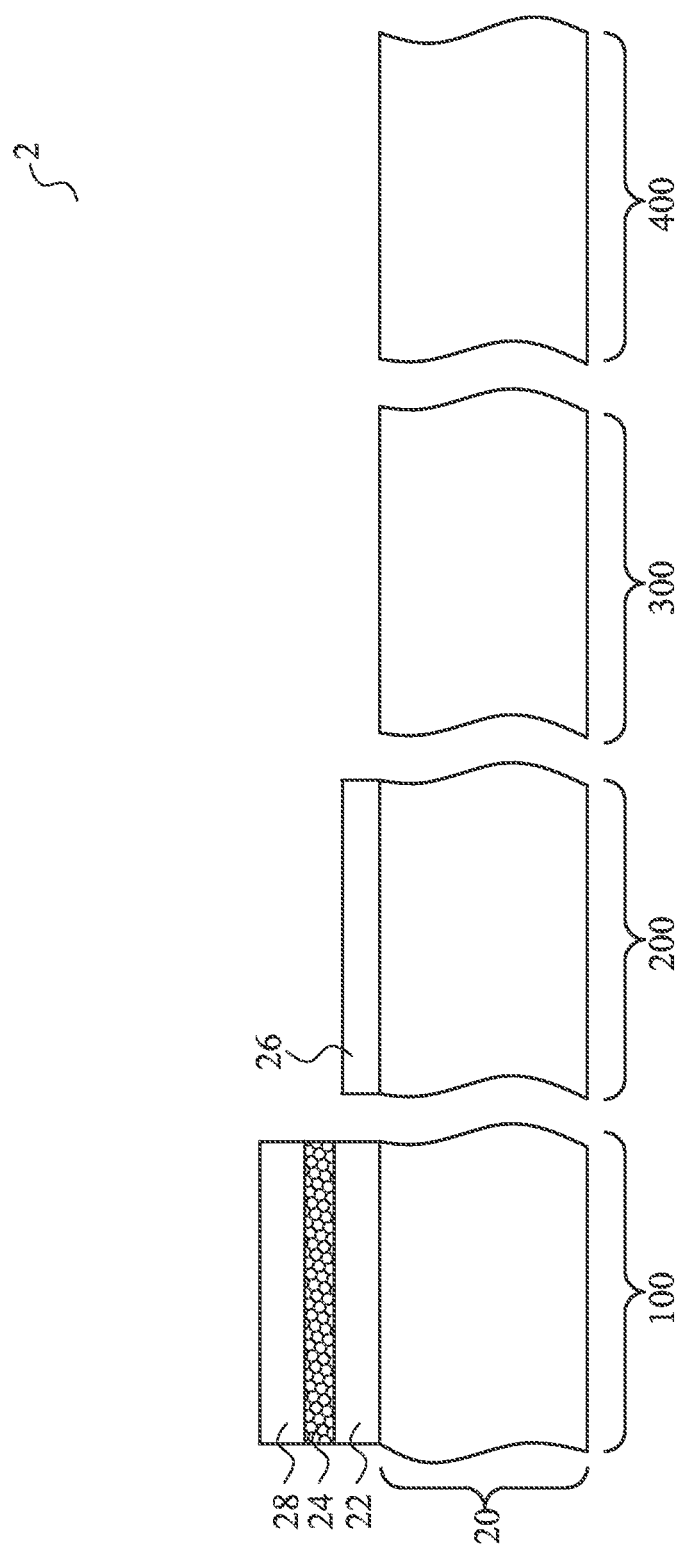
Figure 5:
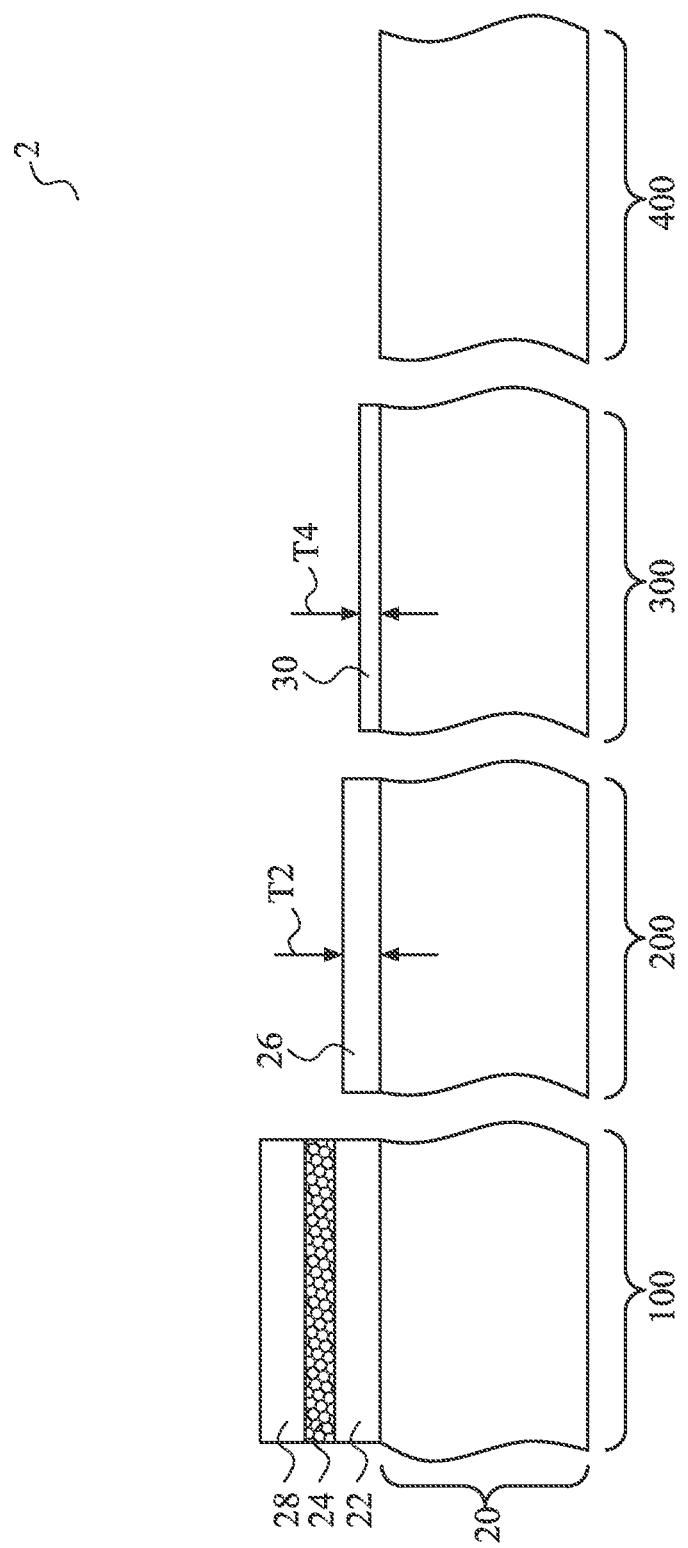

As shown in FIG. 4, HV dielectric layer 26 is patterned, and is removed from regions 300 and 400. Next, Referring to FIG. 5, IO dielectric layer 30 is formed. In some embodiments, IO dielectric layer 30 comprises silicon oxide. Alternatively, IO dielectric layer 30 comprises silicon oxynitride. Thickness T4 of IO dielectric layer 30 may be between about 20 Å and about 70 Å, which may be smaller than thickness T2 of HV dielectric layer 26 in some embodiments. Similarly, IO dielectric layer 30 may be formed through the thermal oxidation of substrate 20, deposition, or the like. After the formation of IO dielectric layer 30, IO dielectric layer 30 is removed from region 400.

Figure 6:
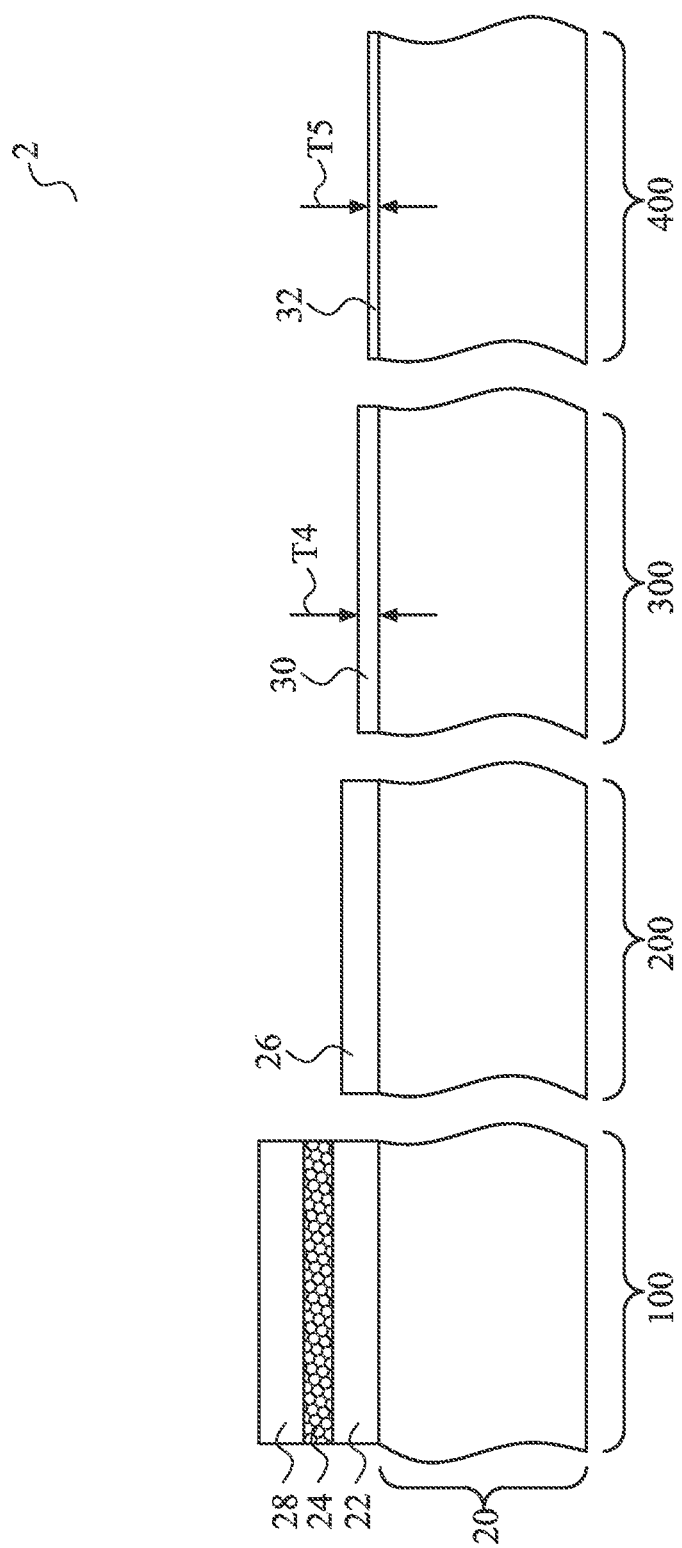

Referring to FIG. 6, interfacial layer 32 is formed on substrate 20. Interfacial layer 32 may comprise chemical oxide, a thermal oxide, or the like. In some embodiments, interfacial layer 32 is formed by oxidizing the exposed surface portion of substrate 20. In alternative embodiments, interfacial layer 32 is formed by treating the surface portion of substrate 20 using a chemical, for example, an oxidant such as ozone water or hydrogen peroxide. The resulting interfacial layer 32 is referred to as a chemical oxide layer, which comprises silicon oxide. Thickness T5 of interfacial layer 32 may be between about 5 Å and about 30 Å, which may be smaller than thickness T4 of IO dielectric layer 30 in some embodiments.

Figure 7:
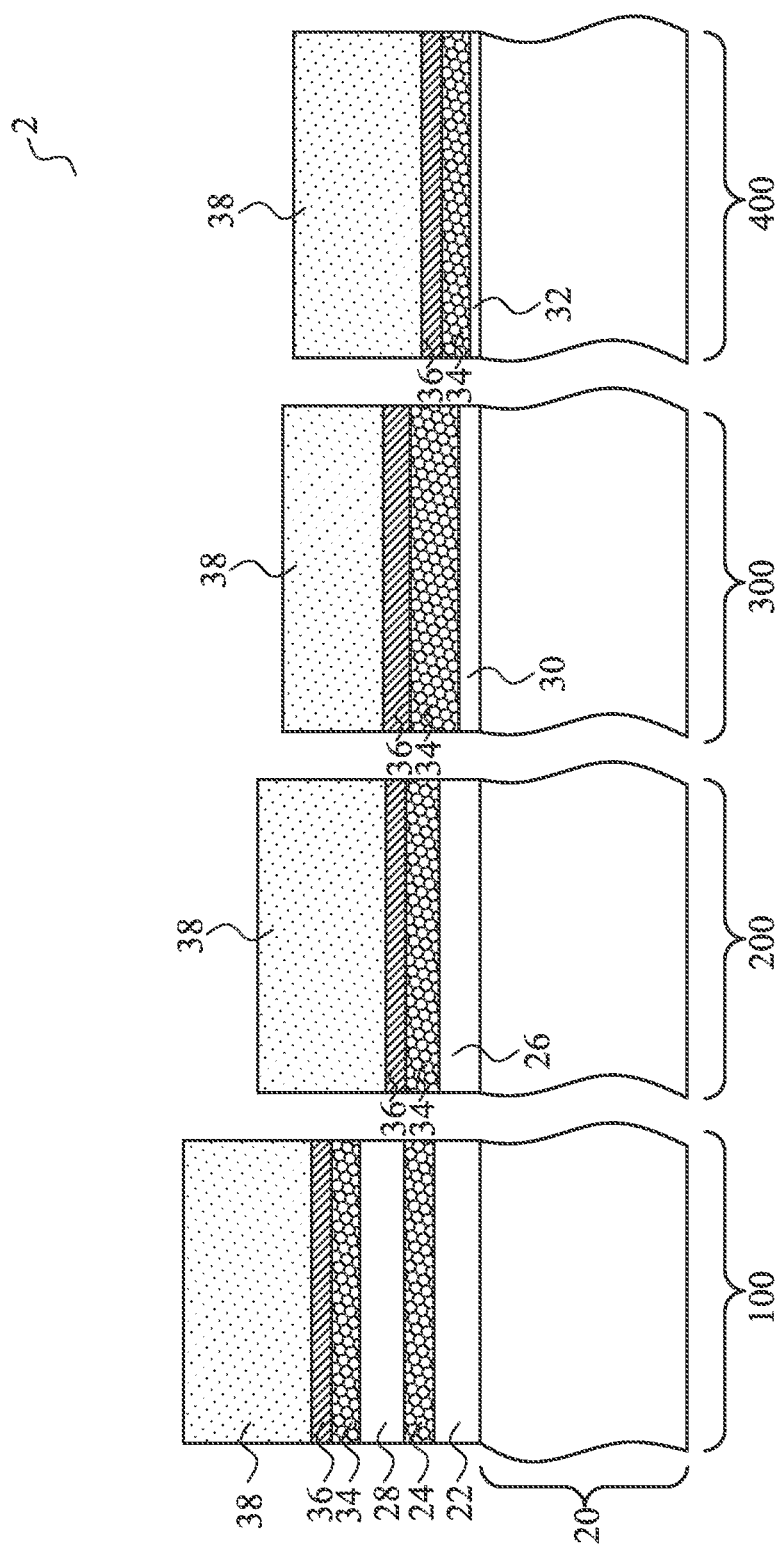

Referring to FIG. 7, high-k dielectric layer 34, capping layer 36, and polysilicon layer 38 are formed sequentially, and are formed in regions 100, 200, 300, and 400 simultaneously. Accordingly, each of layers 34, 36, and 38 has a same thickness and a same material in regions 100, 200, 300, and 400. High-k dielectric layer 34 may have a k value greater than about 7.0, and may include an oxide or a silicate of Hf, Al, Zr, La, Mg, Ba, Ti, Pb, Yb, Pr, Nd, Gd, Er, Dy, or combinations thereof. Exemplary materials of high-k dielectric layer 34 include $MgO_x$, $BaTi_xO_y$, $BaSr_xTi_yO_z$, $PbTi_xO_y$, $PbZr_xTi_yO_z$, and the like, with values X, Y, and Z being between 0 and 1. The thickness of high-k dielectric layer 34 may be between about 0.5 nm and about 10 nm. The formation methods of high-k dielectric layer 34 may include Molecular-Beam Deposition (MBD), Atomic Layer Deposition (ALD), Physical Vapor Deposition (PVD), and the like.

Over high-k dielectric layer 34, capping layer 36 may be formed. In some embodiments, capping layer 36 comprises titanium nitride (TiN). In alternative embodiments, the exemplary materials of capping layer 36 include tantalum-containing materials and/or titanium-containing materials such as TaC, TaN, TaAlN, TaSiN, and combinations thereof. Polysilicon layer 38 is then formed over capping layer 36.

Figure 8:
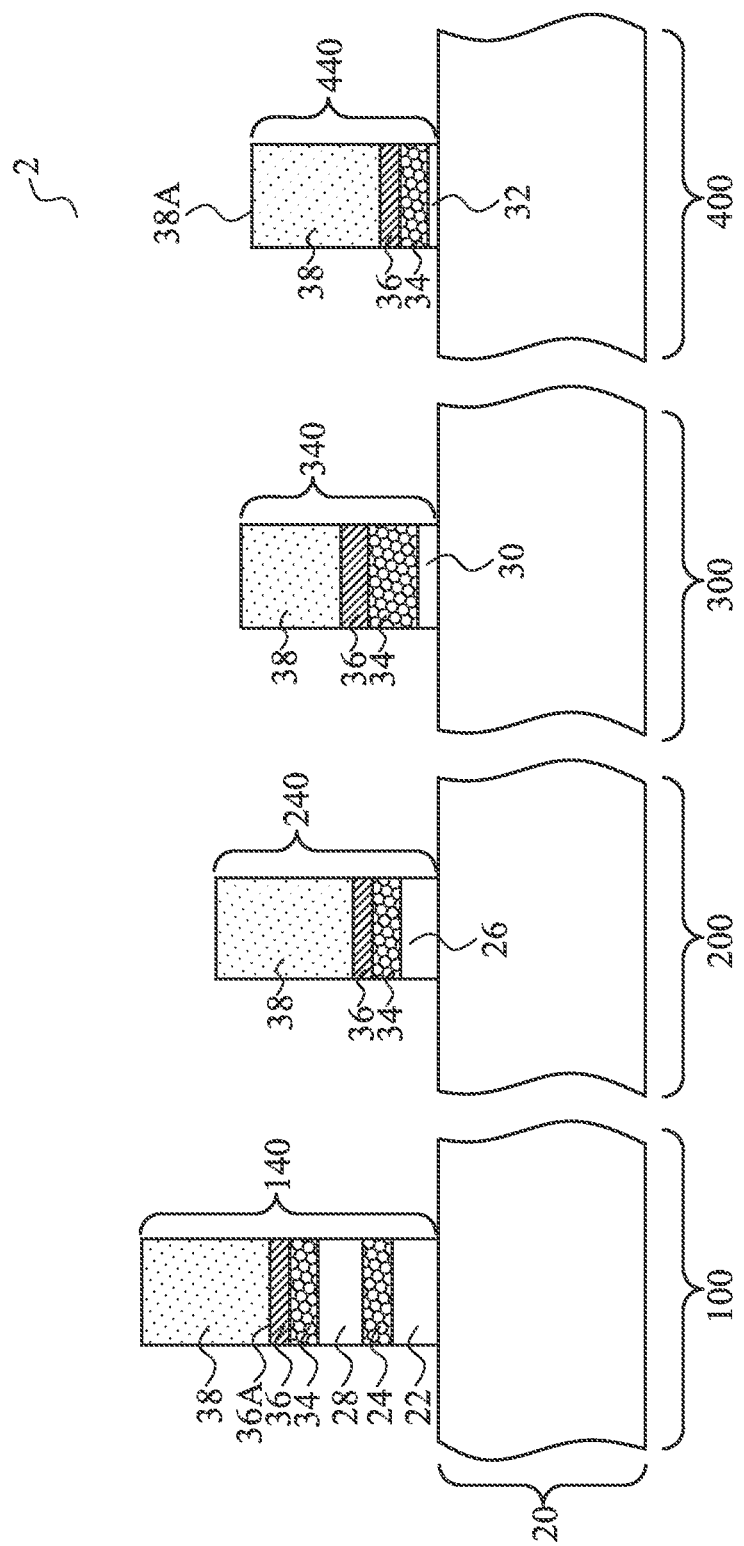

FIGS. 8 through 13 illustrate the formation of devices in regions 100, 200, 300, and 400 using a gate-last approach, wherein the gates of the devices are referred to as replacement gates. In these embodiments, polysilicon layer 38 acts as the dummy gate that is replaced by the replacement gates. Referring to FIG. 8, layers 22, 24, 26, 28, 30, 32, 34, 36, and 38 are patterned, forming layer stacks 140, 240, 340, and 440 in regions 100, 200, 300, and 400, respectively. In these embodiments, the top surface 38A of the portion of dummy gate 38 in region 400 is higher than top surface 36A of the portion of capping layer 36 in region 100 to ensure that after the subsequent CMP (FIG. 12), dummy gate 38 remains in each of layer stacks 140, 240, 340, and 440. After the patterning, lightly doped source and drain regions (not shown) and/or packet regions (not shown) may be formed adjacent to either one or all layer stacks 140, 240, 340, and 440.

Figure 9:
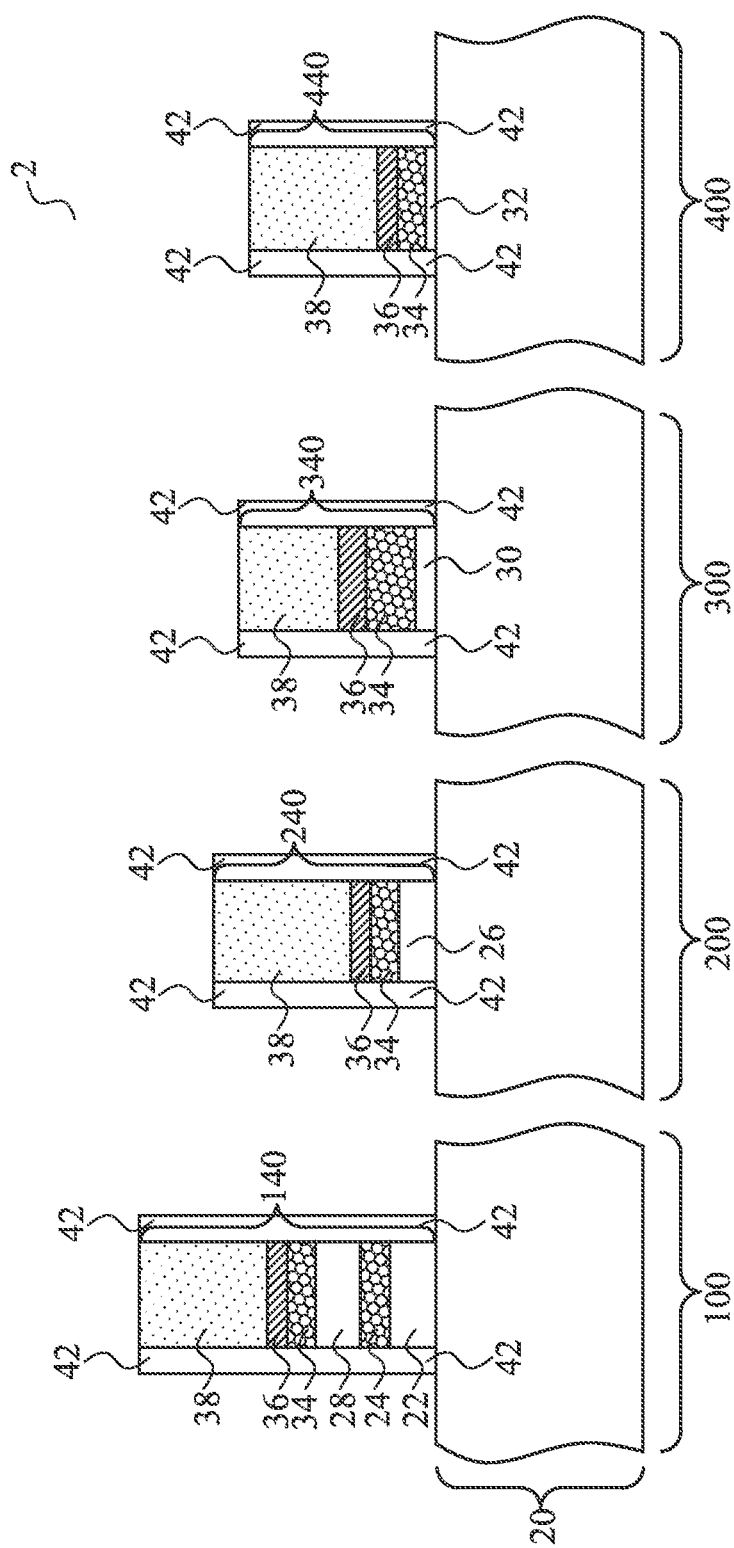

Next, referring to FIG. 9, gate spacers 42 are formed on the sidewalls of layer stacks 140, 240, 340, and 440. In some embodiments, gate spacers 42 comprise silicon nitride, although other dielectric materials may also be used. The formation of gate spacers 42 includes forming a blanket layer(s), and performing an anisotropic etching to remove the horizontal portions of the blanket layer. The remaining portions of the blanket layer form gate spacers 42.

Figure 10:
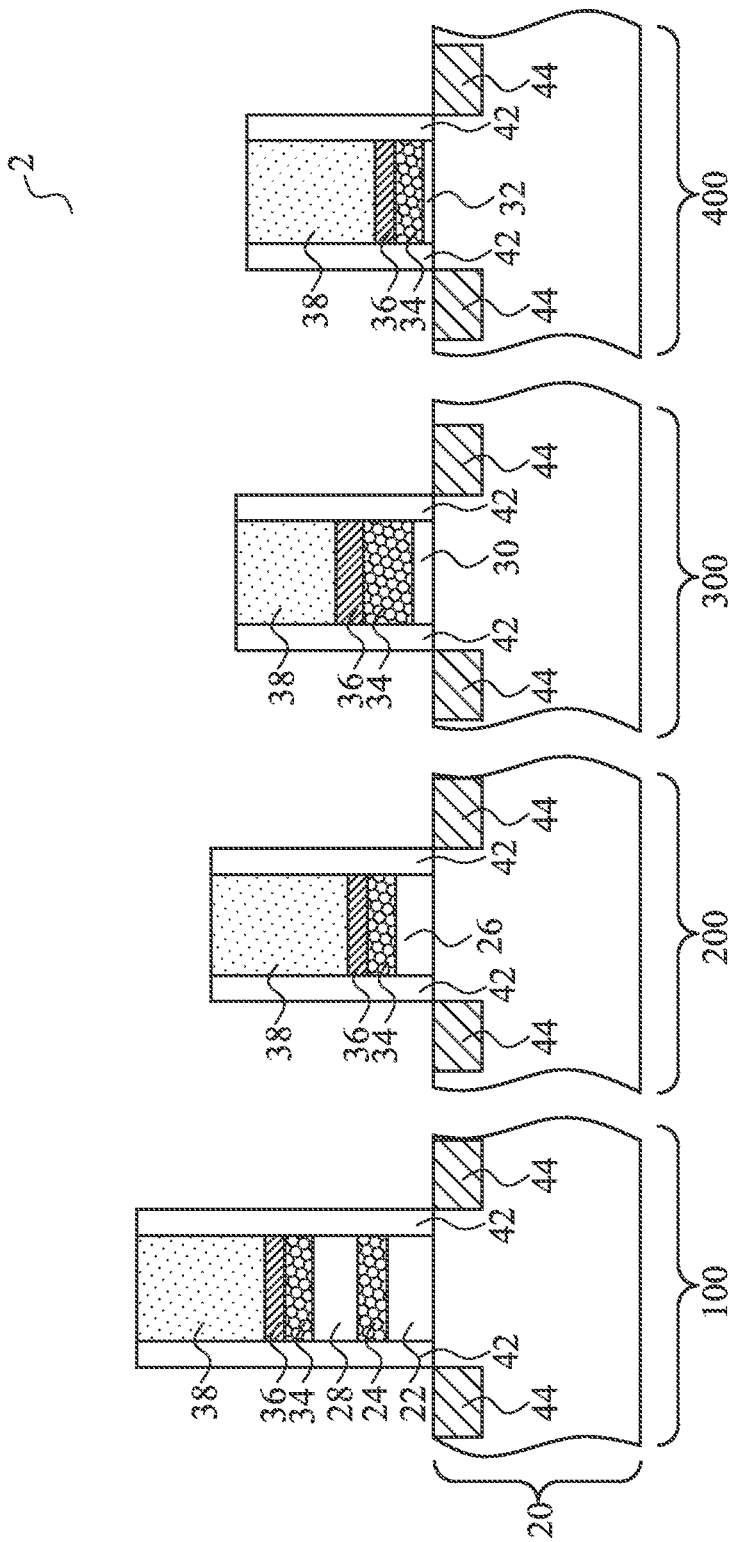

FIG. 10 illustrates the formation of source and drain regions 44, which are alternatively referred to as a source/drain regions 44 hereinafter. Source/drain regions 44 may be formed through implantation or epitaxy. The formation details of source/drain regions 44 are not discussed herein.

Figure 11:
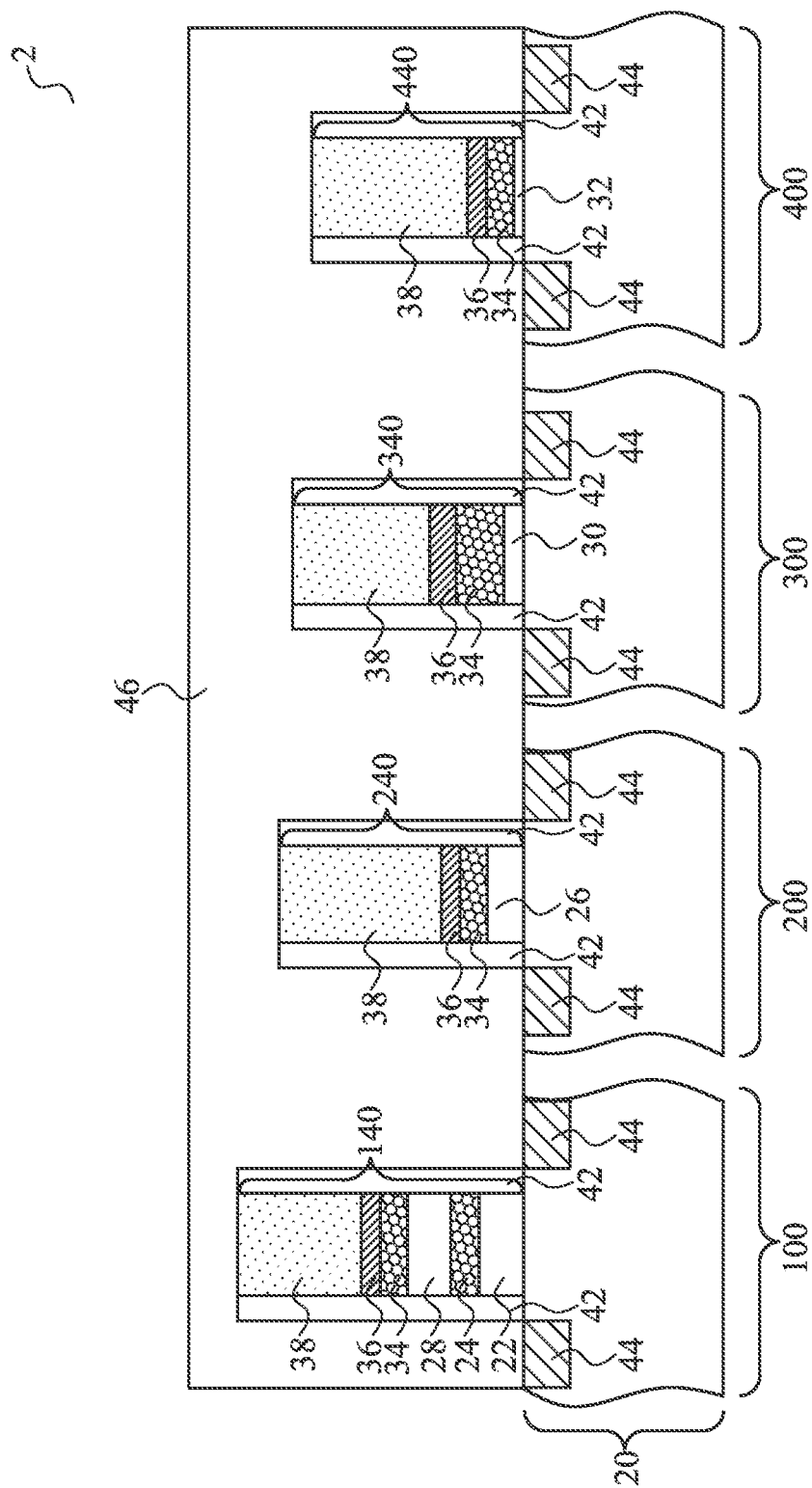
Figure 12:
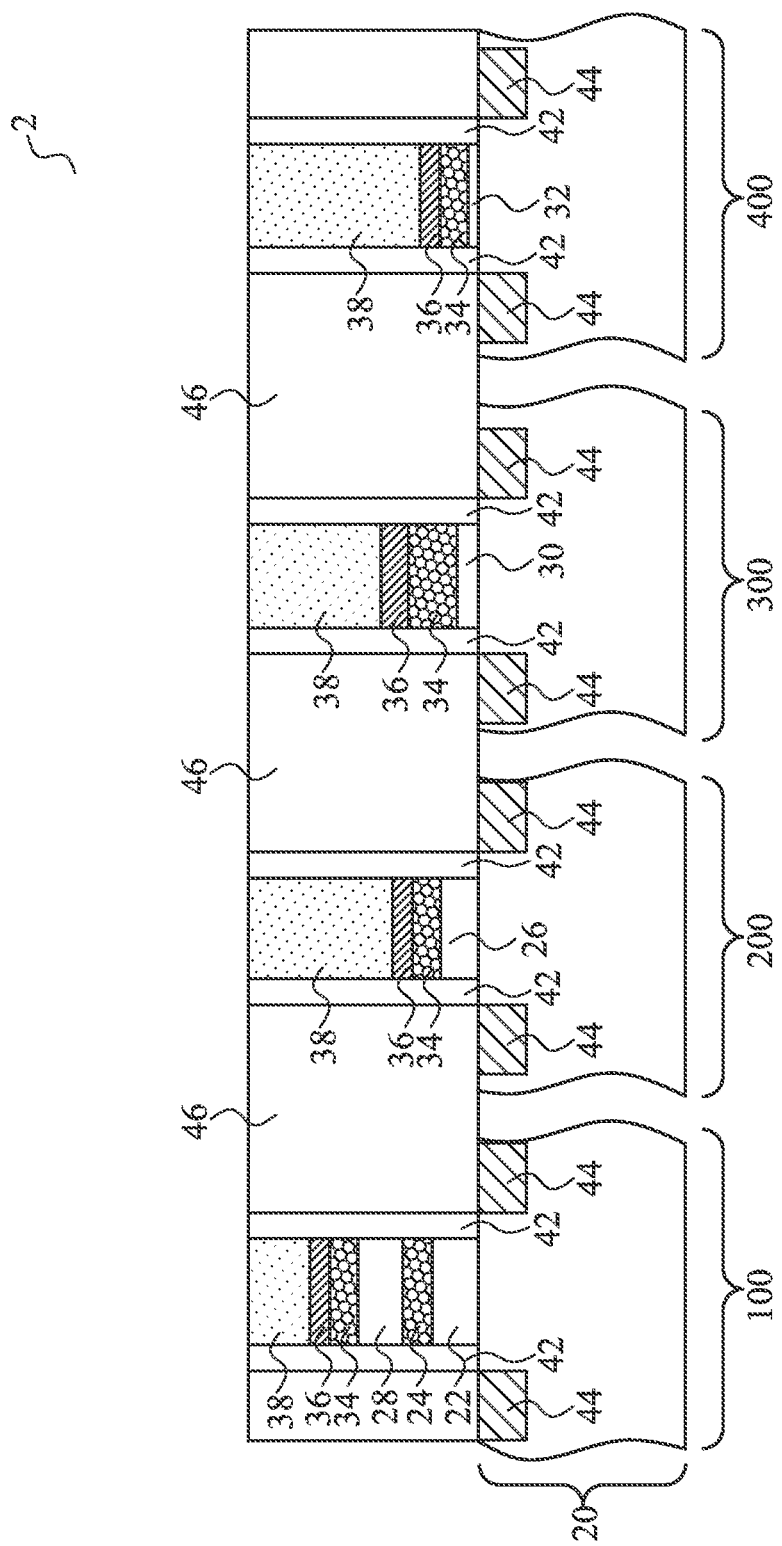

FIG. 11 illustrates the formation of Inter-Layer Dielectric (ILD) 46, which is formed of a dielectric material such as Phospho-Silicate Glass (PSG), Boro-Silicate Glass (BSG), Boron-Doped Phospho-Silicate Glass (BPSG), or the like. ILD 46 has a top surface higher than the top surface of layer stacks 140, 240, 340, and 440. A CMP may be performed to level the top surface of ILD 46 and the top surfaces of the layer stacks, as shown in FIG. 12.

Figure 13:
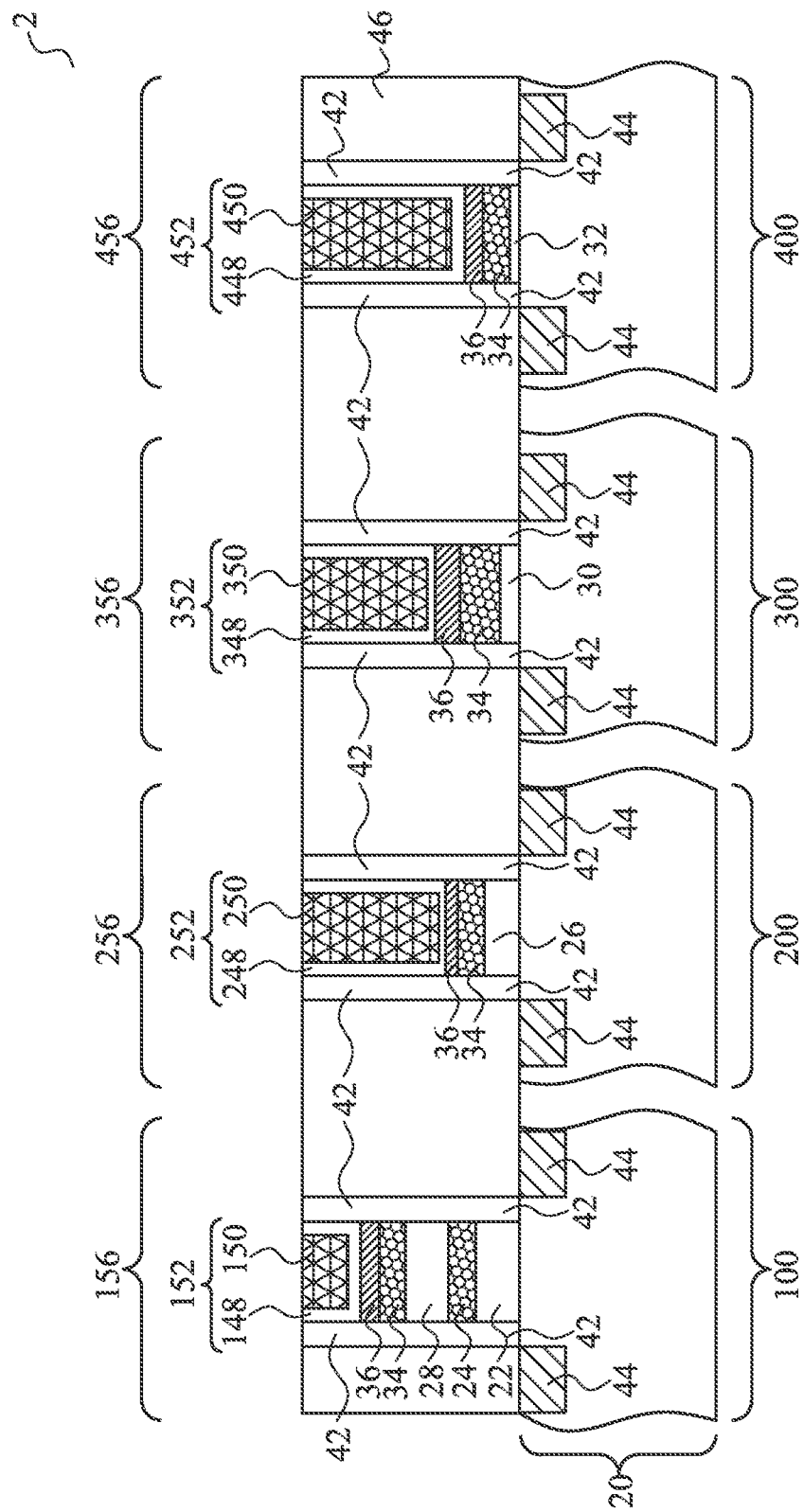

Referring to FIG. 13, the remaining portions of polysilicon layer 38 are removed, for example, through etching, and are replaced with replacement gates. Hence, polysilicon layer 38 is referred to as a dummy gate throughout the description. The replacement gates include metal gate electrodes 152, 252, 352, and 452. Metal gate electrodes 152, 252, 352, and 452 may have a single layer structure or a multi-layer structure including a plurality of layers, which is schematically illustrated using reference notations 148 and 150. Metal gate electrode 152 forms the gate electrode of embedded flash memory 156. Metal gate electrode 252 forms the gate electrode of HV device (transistor) 256. Metal gate electrode 352 forms the gate electrode of IO device (transistor) 356. Metal gate electrode 452 forms the gate electrode of core or SRAM device (transistor) 456. Gate electrodes 152, 252, 352, and 452 may comprise metal or metal alloys such as Cu, W, Co, Ru, Al, TiN, TaN, TaC, combinations thereof, and multi-layers thereof.

In subsequent steps, contact openings (not shown) are formed in ILD 46, exposing underlying source/drain regions 44. Source/drain silicides and sourced/drain contact plugs (not shown) may be formed to electrically couple to source/drain regions 44. The formation of memory device 156, HV transistor 256, IO transistor 356, and core/SRAM transistor 456 is thus finished.

Figure 14:
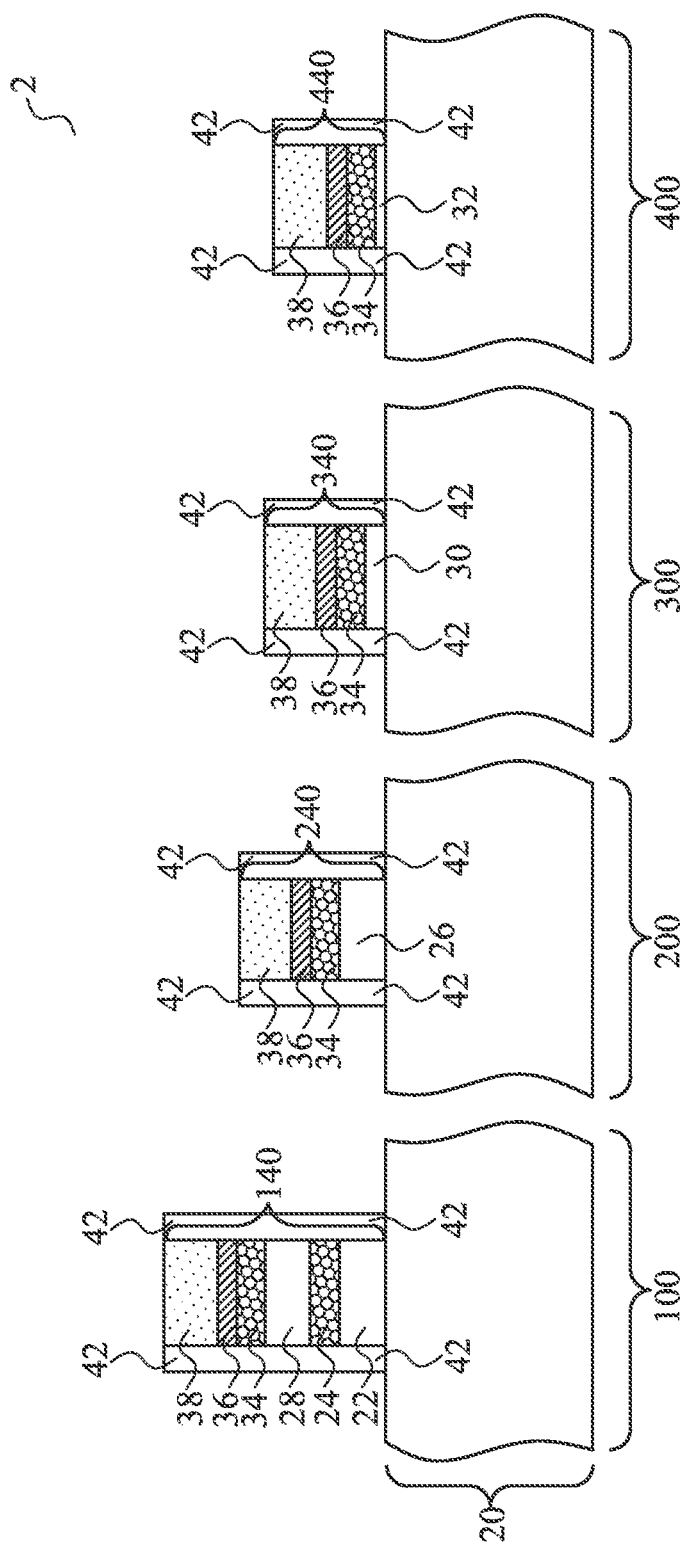
FIGS. 14, 15, and 16 are cross-sectional views of intermediate stages in the manufacturing of embedded memory devices and other types of devices in accordance with alternative embodiments, wherein a gate-first approach is used.
Figure 15:
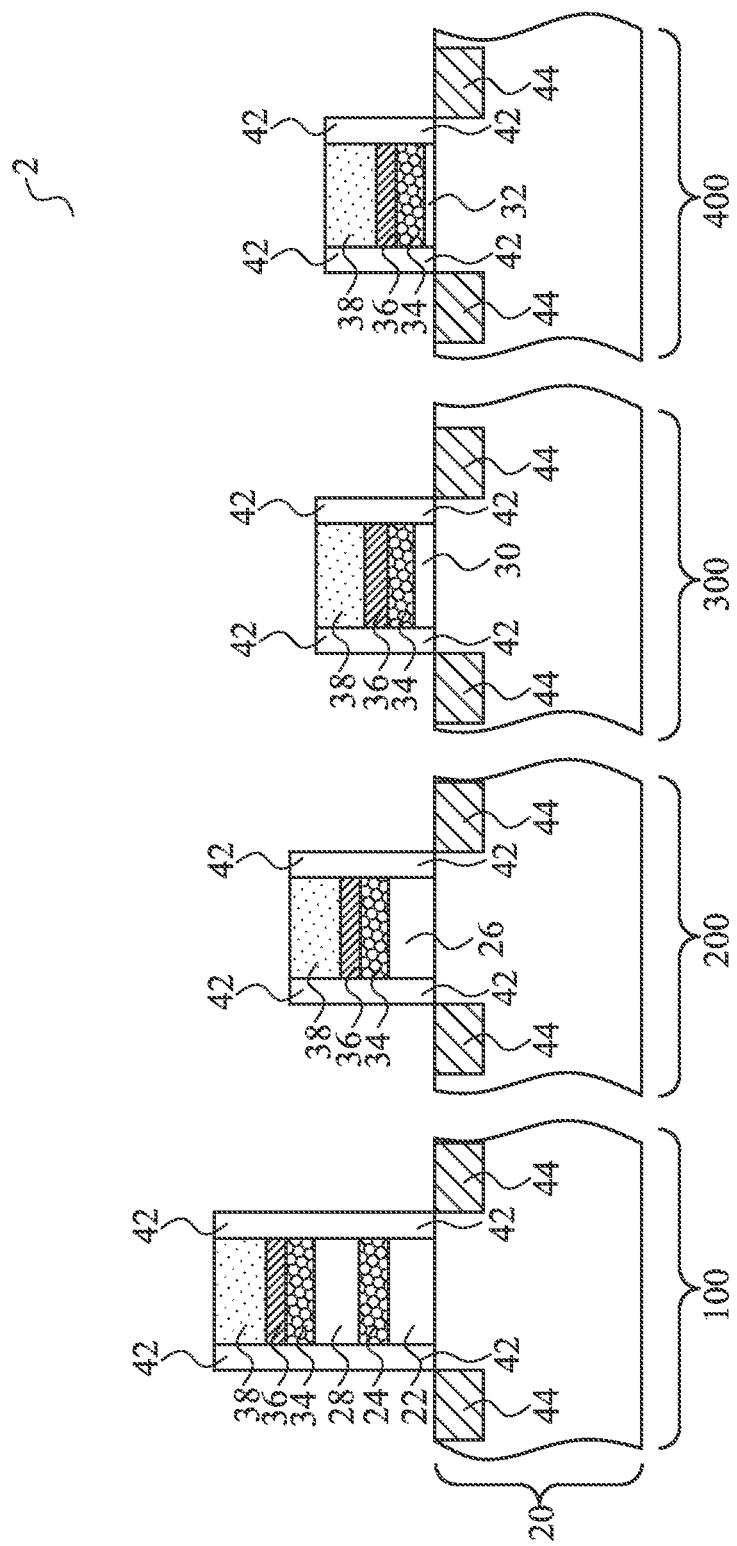
Figure 16:
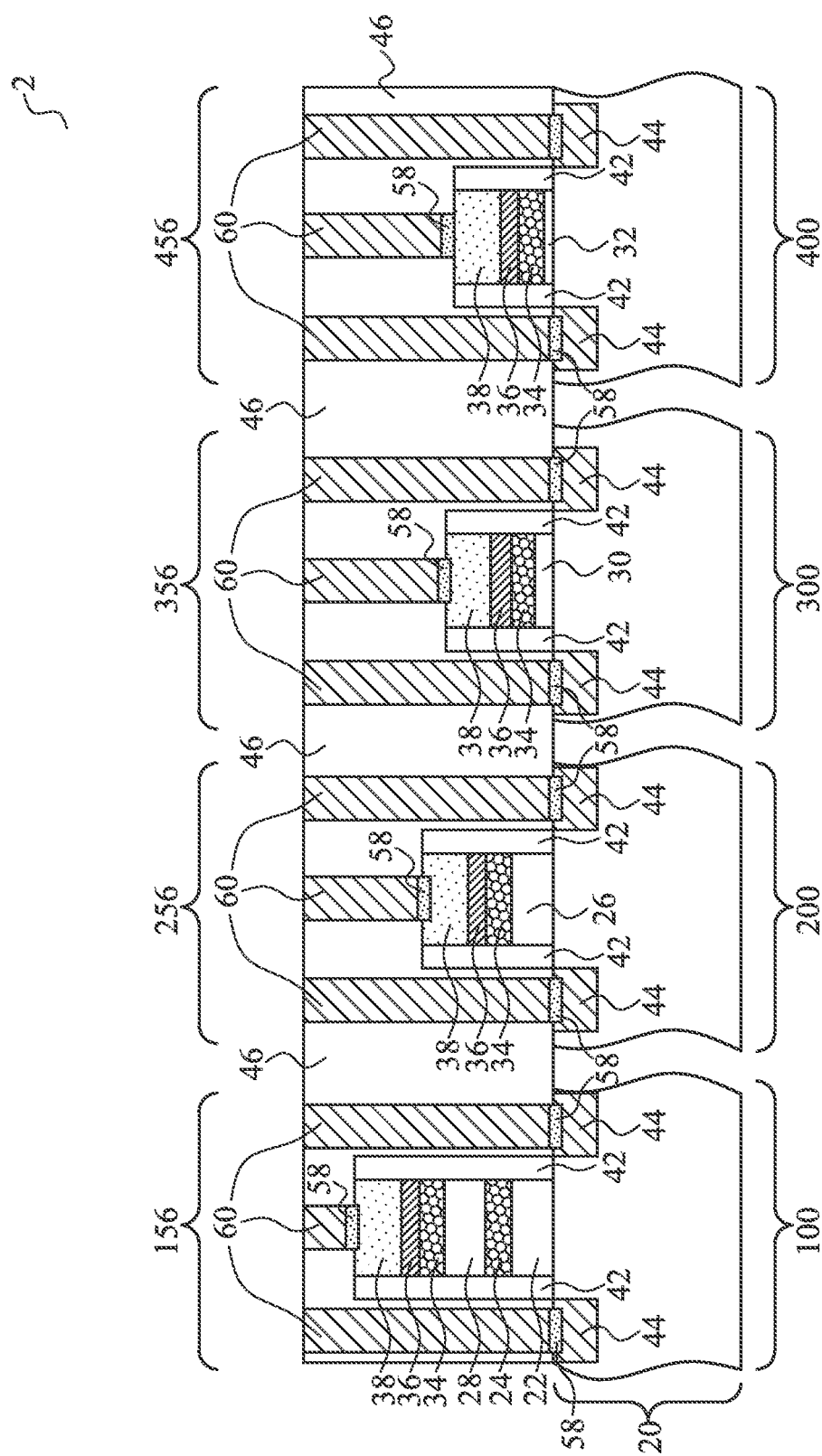

FIGS. 14 through 16 illustrate the formation of devices in regions 100, 200, 300, and 400 using a gate-first approach, as compared to the gate-last approach in FIGS. 8 through 13. In these embodiments, since polysilicon layer 38 form gate electrodes of the resulting devices, polysilicon layer 38 are not removed. The initial steps are essentially the same as in FIGS. 1 through 7. Next, the stacked layers in FIG. 7 are patterned to form gate stacks 140, 240, 340, and 440, as shown in FIG. 14. Gate spacers 42 are then formed on the sidewalls of the gate stacks. Lightly doped source and drain regions (not shown) and pocket regions (not shown) may also be formed at this step. Next as shown in FIG. 15, source/drain regions 44 are formed.

In a subsequent step, as shown in FIG. 16, ILD 46 is formed to cover gate stacks 140, 240, 340, and 440, followed by a CMP step to level the top surface of ILD 46. The top surface of the ILD 46 is higher than the top surfaces of gate stacks 140, 240, 340, and 440 in these embodiments. Next, contact plug openings (occupied by contact plugs 60) are formed by etching ILD 46. Polysilicon layer 38 and source/drain regions 44 are thus exposed. The exposed portions of polysilicon layer 38 and source/drain regions 44 are silicided to from silicide regions 58. The contact plug openings are then filled with a conductive material such as tungsten, aluminum, copper, and/or the like to form contact plugs 60.

In accordance with the embodiments of the present disclosure, as shown in FIGS. 13 and 16, high-k dielectric layer 34 is formed over the top dielectric layer 28 to form the blocking layer of the resulting embedded flash memory device 156. With the dual layer structure of the blocking layer, the thickness of the high-k dielectric and the top dielectric layer may be reduced without sacrificing the charge retention ability of the memory devices. On the other hand, with the formation of the metal gates in the memory device 156, the mismatch between the threshold voltages of different embedded flash memory devices is reduced. This is advantageous for the formation of flash memory devices having different threshold voltage levels in a same chip. With small mismatch, different levels of threshold voltages may be clearly distinguished from each other.

In accordance with some embodiments, an embedded flash memory device includes a gate stack, and source and drain regions in the semiconductor substrate. The first source and drain regions are on opposite sides of the gate stack. The gate stack includes a bottom dielectric layer over the semiconductor substrate, a charge trapping layer over the bottom dielectric layer, a top dielectric layer over the charge trapping layer, a high-k dielectric layer over the top dielectric layer, and a metal gate over the high-k dielectric layer.

In accordance with other embodiments, a device includes an embedded flash memory device and a transistor. The embedded flash memory device includes a first gate stack. The first gate stack includes a bottom silicon oxide layer over the semiconductor substrate, a charge trapping layer over the bottom silicon oxide layer, a top oxide layer over the charge trapping layer, a first high-k dielectric layer over and contacting the top oxide layer, a first metal capping layer over and contacting the first high-k dielectric layer, and a first metal gate over the first metal capping layer. The transistor includes a second gate stack, which includes an oxide layer over the semiconductor substrate, and a second high-k dielectric layer over and contacting the oxide layer. The first and the second high-k dielectric layers have a same thickness, and are formed of a same material. The second gate stack further includes a second metal capping layer over and contacting the second high-k dielectric layer, wherein the first and the second metal capping layers have a same thickness, and are formed of a same material. The second gate stack further includes a second metal gate over the second metal capping layer.

In accordance with yet other embodiments, a method includes forming a stack of layers, which includes forming a bottom dielectric layer over a semiconductor substrate and in a first device region, forming a charge trapping layer over the bottom dielectric layer, forming a top dielectric layer over the charge trapping layer, and forming a first high-k dielectric layer over the top dielectric layer. The method further includes patterning the stack of layers, forming a first metal gate over the stack of layers, and forming first source and drain regions in the semiconductor substrate. The stack of layers, the first metal gate, and the first source and drain regions form portions of an embedded flash memory device.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a flash memory device comprising:
    forming a first gate stack by:
        forming a bottom dielectric layer over a semiconductor substrate;
        forming a charge trapping layer over the bottom dielectric layer;
        forming a top dielectric layer disposed directly on the charge trapping layer;
        depositing a first high-k dielectric layer over the top dielectric layer; and
        forming a first metal gate over the first high-k dielectric layer; and
    forming first source and drain regions in the semiconductor substrate, wherein the first source and drain regions are on opposite sides of the first gate stack; and
    forming a second gate stack comprising by:

forming a second dielectric layer disposed directly on the semiconductor substrate;

forming a second high-k dielectric layer over the dielectric layer; and forming a second metal gate over the second high-k dielectric layer; and forming second source and drain regions in the semiconductor substrate, wherein the second source and drain regions are on opposite sides of the second gate stack, wherein the first high-k dielectric layer has the same thickness and is formed of the same material as the second high-k dielectric layer, and wherein the top dielectric and second dielectric are the same thickness and material.

2. The method of claim 1, wherein the top dielectric layer comprises silicon oxide or silicon oxynitride.

3. The method of claim 1 further comprising:
forming a first metal capping layer overlying the first high-k dielectric layer and underlying the first metal gate.

4. The method of claim 1, wherein the first metal gate and the second metal gate are formed of the same material, and have the same thickness.

5. The device of claim 1 further comprising:
forming a third gate stack comprising by:
forming an IO dielectric layer over the semiconductor substrate, wherein the IO dielectric layer has a thickness smaller than a thickness of the top dielectric layer;
forming a third high-k dielectric layer over the IO dielectric layer; and
forming a third metal gate over the third high-k dielectric layer; and
forming third source and drain regions in the semiconductor substrate, wherein the third source and drain regions are on opposite sides of the third gate stack.

6. The method of claim 1 further comprising:
forming a fourth gate stack comprising by:
forming an interfacial dielectric layer over the semiconductor substrate;
forming a fourth high-k dielectric layer over the interfacial dielectric layer; and
forming a fourth metal gate over the fourth high-k dielectric layer; and
forming fourth source and drain regions in the semiconductor substrate, wherein the fourth source and drain regions are on opposite sides of the fourth gate stack.

7. A method comprising:
providing a semiconductor substrate;
forming a flash memory device comprising a first gate stack, wherein the first gate stack comprises:
a bottom silicon oxide layer over the semiconductor substrate;
a charge trapping layer over the bottom silicon oxide layer;
a top oxide layer disposed physically contacting the charge trapping layer;
a first high-k dielectric layer over the top oxide layer;
a first conductive capping layer over and contacting the first high-k dielectric layer; and
a first conductive gate over the first conductive capping layer; and
forming a transistor comprising a second gate stack, wherein the second gate stack comprises:
a second top oxide layer disposed physically contacting the semiconductor substrate and underlying a second high-k dielectric layer;
the second high-k dielectric layer over the second portion of the top oxide layer;
wherein the second gate stack further comprises a second conductive capping layer over and contacting the second high-k dielectric layer; and
a second conductive gate over the second conductive capping layer;
wherein the first high-k dielectric layer and second high-k dielectric layer are of the same material;
wherein the first conductive capping layer and the second conductive capping layer are of the same material, and
wherein the top oxide layer and second top oxide layer are the same thickness and material.

8. The method of claim 7, wherein the first conductive gate and the second conductive gate comprise metal gates, with top surfaces of the first conductive gate and the second conductive gate being coplanar.

9. The method of claim 8, wherein the first conductive gate has a height smaller than a height of the second conductive gate.

10. The method of claim 7, wherein the first conductive gate and the second conductive gate comprise polysilicon gates, with a top surface of the first conductive gate being higher than a top surface of the second conductive gate.

11. The method of claim 7, wherein the first conductive capping layer comprises titanium or tantalum.

12. The method of claim 7, wherein the charge trapping layer comprises a dielectric material.

13. The method of claim 7, wherein the first high-k dielectric layer physically contacts the first top oxide layer.

14. A method comprising:
forming a bottom dielectric layer over a semiconductor substrate in a first device region and a second device region;
forming a charge trapping layer over the bottom dielectric layer in the first and second device regions;
removing the charge trapping layer and the bottom dielectric layer from the second device region;
after removing the charge trapping layer and the bottom dielectric layer from the second device region, forming a top dielectric layer over the charge trapping layer in the first device region and directly on the semiconductor substrate in the second device region;
forming a first high-k dielectric layer over the top dielectric layer in the first and second device regions;
forming a first metal gate over the first high-k dielectric layer in the first device region; and
forming first source and drain regions in the semiconductor substrate in the first device region, wherein the first metal gate and the first source and drain regions in the first device region form portions of an embedded flash memory device.

15. The method of claim 14, further comprising forming a capping layer over the first high-k dielectric layer in the first and second regions.

16. The method of claim 14, further comprising:
forming an oxide layer over and contacting the semiconductor substrate in a third device region,
wherein forming the first high-k dielectric layer over the top dielectric layer in the first and second device regions includes forming the high-k dielectric layer over the oxide layer in the third device region.

17. The method of claim 16, wherein the oxide layer is formed through thermal oxidation of the semiconductor substrate, and
wherein and the top dielectric layer is formed through deposition.

18. The method of claim 14, wherein the step of forming the first metal gate comprises:
   forming a polysilicon layer over the first high-k dielectric layer; and
   after forming the first source and drain regions, replacing the polysilicon layer with the first metal gate.

19. The method of claim 14, wherein the first high-k dielectric layer in the first device region has the same thickness as the first high-k dielectric layer in the second device region, and
   wherein the top dielectric layer in the first device region has the same thickness as the top dielectric layer in the second device region.

20. The method of claim 16, further comprising forming an interfacial layer directly on the semiconductor substrate in a fourth device region, wherein the fourth region is free of the oxide layer, and
   wherein forming the first high-k dielectric layer over the top dielectric layer in the first and second device regions includes forming the high-k dielectric layer over the interfacial layer in the fourth device region.

\* \* \* \* \*